United States Patent [19]
Hong Vuong

[11] Patent Number: 5,800,856
[45] Date of Patent: Sep. 1, 1998

[54] MASK STENCIL WEAR INDICATOR

[75] Inventor: Loan T. Hong Vuong, Parkland, Fla.

[73] Assignee: Motorola, Inc., Schaumburg, Ill.

[21] Appl. No.: 943,446

[22] Filed: Oct. 3, 1997

[51] Int. Cl.⁶ ............................................. B05D 1/00
[52] U.S. Cl. .................. 427/9; 427/96; 427/272; 427/282; 118/504; 118/505; 101/127
[58] Field of Search .................. 118/213, 301, 118/406, 504, 505; 427/9, 96, 272, 282; 101/127; 29/847

[56] References Cited

U.S. PATENT DOCUMENTS 5,232,736  8/1993  Tribbey et al. ........................ 427/8
5,436,028  7/1995  Becher et al. ....................... 427/96

Primary Examiner—Laura Edwards

[57] ABSTRACT

A mask stencil (112) is made with at least one indicator line (204, 205) of material pre-removed from a wear surface (212) of the mask stencil, the depth of the line is approximately the amount of stencil mask material that can be worn from the wear surface of the mask stencil by a squeegee (110) without adversely affect an amount of solder paste (114) that accumulates on a printed circuit board substrate (116) through openings (201) in the mask stencil. In another embodiment, the mask stencil (112) is made with at least one indicator line (304, 305) of material pre-removed from a surface opposite (314) the wear surface (312). The amount of stencil mask material that remains above the indicator line is approximately equal to the amount of material that can be worn from the wear surface of the mask stencil by the squeegee without adversely affect an amount of solder paste that accumulates on the printed circuit board.

6 Claims, 3 Drawing Sheets

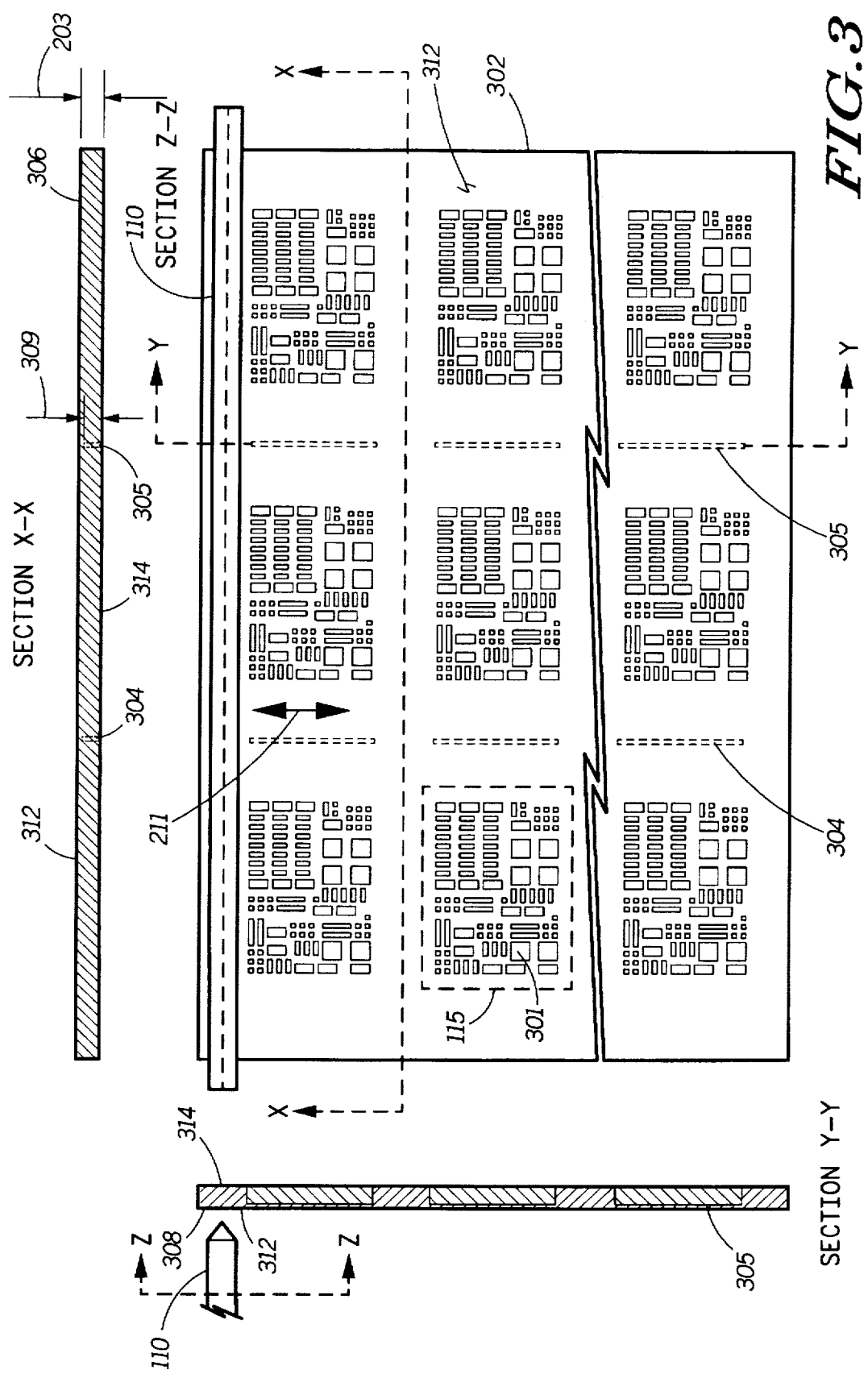

MASK STENCIL WEAR INDICATOR

FIELD OF THE INVENTION

This invention relates in general to manufacturing processes, and more specifically to a process for applying solder paste to printed circuit boards.

BACKGROUND OF THE INVENTION

Microelectronic component assembly relies heavily on automated surface mount assembly techniques due to the repetitive nature of the assembly process and the size of the components. The assembly process generally involves the placement of a number of microelectronic components on printed circuit boards. Solder paste is the most conventional material used in the electronics industry to couple the components to printed circuit boards. Currently, the electronics industry uses several types of application methods to dispense solder paste on a printed circuit board. These automated methods include metal mask stencil printing and screen printing.

In automated processes performed by stencil solder printing machines, a reflowable conductive paste, e.g., solder paste, is selectively applied to a printed electric circuit board, or printed circuit (pc) board, prior to placement of components on the pc board. Conventionally, a conveyor belt shuttles the pc board first beneath a fixed camera, which records and transmits the position of the pc board to a computer, and then beneath a frame, which holds a stencil corresponding to the pc board. In response to reception of the positional information from the camera, the computer calculates alignment information, which is transmitted to a servomotor coupled to the frame. The servomotor thereafter makes adjustments in the x, y, and ø coordinates of the frame such that the stencil is properly aligned with the pc board. Subsequently, the properly aligned stencil is dropped into contact with the pc board, and a metal squeegee blade wipes across the stencil to push solder paste through openings in the stencil onto the pc board. At the completion of this process, the stencil is lifted from the pc board, which is conveyed from beneath the stencil by the conveyor belt.

The metal mask stencil and the metal squeegee blade rub against each other and become worn after a period of time. Any wearing of the squeegee can be compensated by the servomotor; however, the wearing of the metal mask stencil causes it to become too thin to allow sufficient accumulation of solder paste onto the pc board. With known methods and apparatus, it is not possible to determine through visible observation whether the metal mask stencil has become too thin.

Thus, what is needed is a metal mask stencil that gives a visible indication of when it has become too thin.

BRIEF DESCRIPTION OF THE DRAWINGS

FIG. 3 is a mask stencil in accordance with an alternative preferred embodiment of the invention.

DESCRIPTION OF A PREFERRED EMBODIMENT

Figure 1:
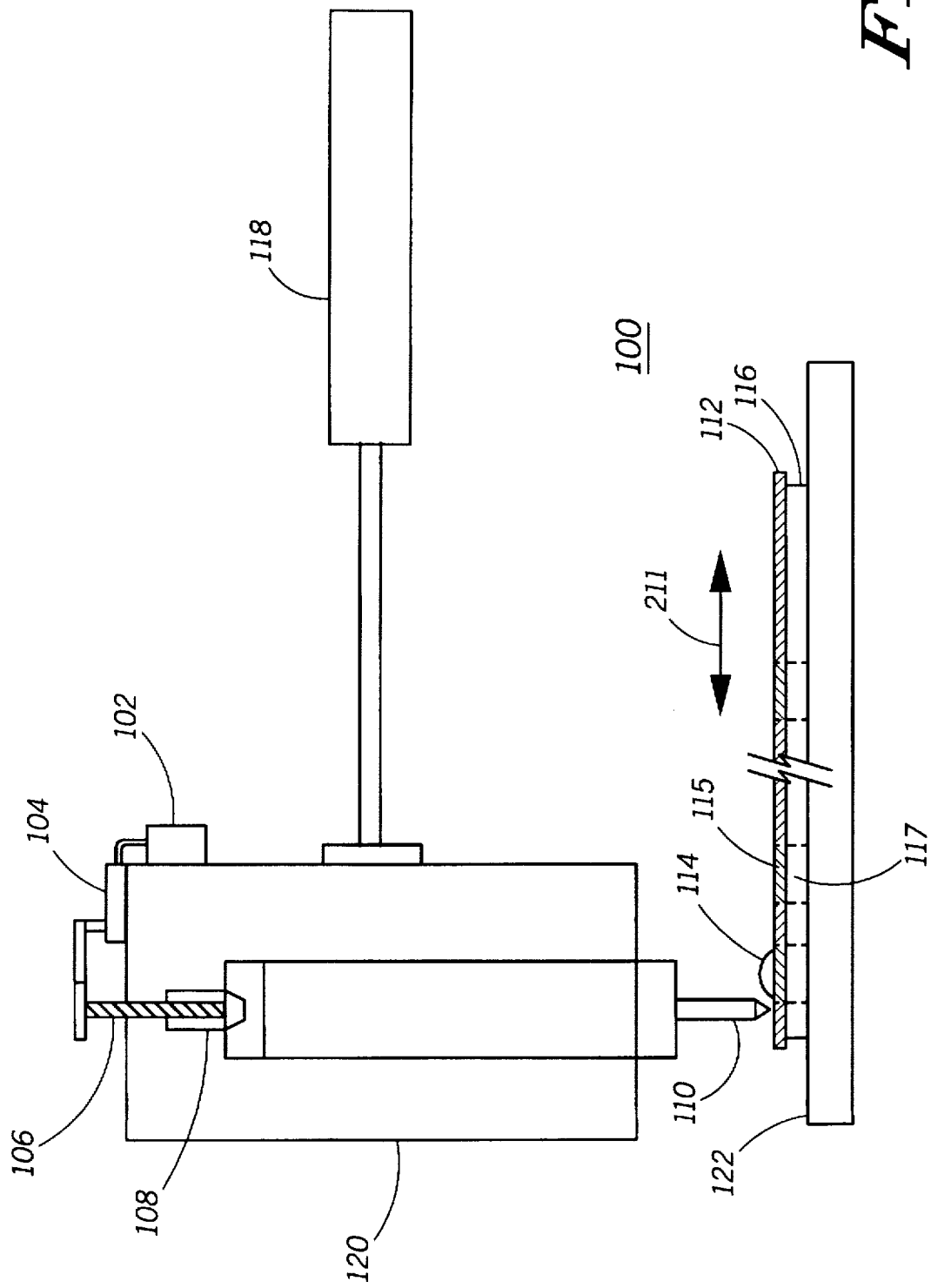
FIG. 1 is a simplified representation of a stencil solder printing machine to which the present invention may be applied.

Referring to FIG. 1, a simplified diagram of a stencil solder printing machine 100 to which the present invention may be applied is shown. A stepper motor control 102 controls a stepper motor 104, driving a lead screw 106 of a micrometer 108, which determines the vertical position of a squeegee 110 with respect to a solder mask stencil, or stencil 112. A printed circuit board substrate, or substrate 116 is disposed between the stencil 112 and a tooling plate or carriage 122. The pressure exerted by a squeegee 110 on the stencil 112 drives an effective amount of solder paste 114 into openings 201 (FIG. 2) in the stencil as the squeegee 110, driven by the hydraulic system 118, moves across the stencil in the directions indicated by arrow 211. Thus the solder paste 114 is applied to the substrate 116 only where permitted by the stencil. The pressure applied to the stencil 112 by the squeegee 110 may be increased or decreased by moving the squeegee 110 closer or farther from the stencil 112, respectively.

A manufacturing computer system (not shown) applies a control signal to a stepper motor control 102 that controls the stepper motor 104. Each stepper motor 104 is bidirectional and is used to control the position of a squeegee 110 with respect to a stencil 112. That position, in turn, controls the pressure exerted by the squeegee on the stencil 112.

A solder paste dispenser (not shown) applies a certain quantity of solder paste to the stencil 112. The solder paste dispenser is internally calibrated to replace solder paste that is used in each application. The stencil 112 is placed over the substrate 116 so that the openings through the stencil 112 correspond to the areas on the printed circuit substrate on which the solder paste is to be applied. The squeegee 110 is moved by a hydraulic system 118 over the stencil 112 to force an effective quantity of solder paste into the openings in the stencil 112. When the squeegee is higher above the stencil 112 there is less pressure on the stencil and consequently more solder paste is applied to the printed circuit substrate. When the quantity of solder paste applied to the printed circuit substrate is greater than a predetermined quantity, the manufacturing computer system instructs the stepper motor control 102 to move the stepper motor 104 closer to the stencil 112, thus increasing the pressure on the stencil 112 and decreasing the quantity of solder to be applied to the substrate 116. On the other hand, when the quantity of solder paste applied to the printed circuit substrate is less than a predetermined quantity, the manufacturing computer system instructs the stepper motor control 102 to move the stepper motor 104 closer to the stencil 112, thus increasing the pressure on the stencil 112 and decreasing the mass of solder paste to be applied to the substrate 116.

This process typically begins when a substrate 116 is placed on a conveyor belt, which, when directed by a control unit, conveys the substrate 116 to a location beneath a fixed camera (not shown). The camera thereafter records an image of the substrate 116 for subsequent transmission to the control unit. In response to reception of the recorded image, the control unit directs the conveyor belt to shuttle the substrate 116 to a second location beneath the stencil 112. The control unit further calculates the exact position of the substrate 116 from pc board features shown in the recorded image and transmits an alignment signal to a servomotor. In response thereto, the servomotor makes multi-axis alignment adjustments to the position of a frame (not shown) in which the stencil 112 is mounted. At the direction of the control unit, when the frame is aligned correctly, a pneumatic arm drops the frame until the stencil 112 contacts the substrate 116. Thereafter, a squeegee 110 is pneumatically lowered to wipe across the stencil 112, thereby pushing solder paste through the stencil 112 onto the substrate 116. In this manner, the solder paste is selectively applied to desired areas of the substrate 116.

The stencil solder printing machine used in accordance with the invention is preferably a Model DEK 265 GS Printing Machine manufactured by DEK Printing Machines Ltd., of Dorset, England, although the invention is also applicable for use with other machines.

Figure 2:
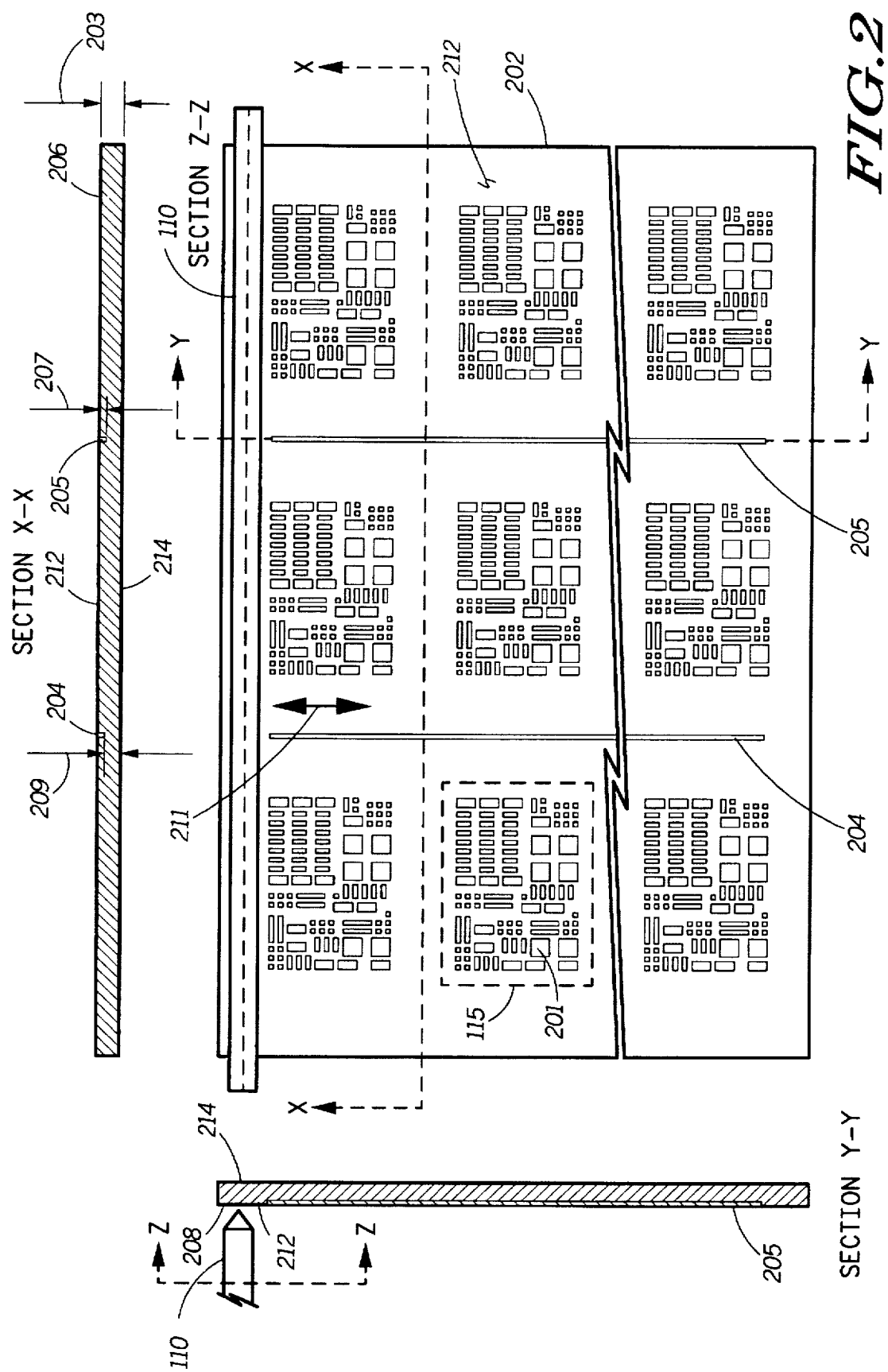
FIG. 2 is a mask stencil in accordance with a preferred embodiment of the invention.

Referring now to FIG. 2, a top view 202 of the stencil 112 of FIG. 1 is shown. The squeegee 110 and the stencil 112 are preferably metal, and further preferably stainless steel, although other such materials are also acceptable. The stencil is substantially flat and has openings 201 cut into it at locations corresponding to locations on the substrate 116 at which solder paste is to be deposited. Preferably, the substrate 116 comprises a plurality of smaller individual pc boards such as pc board 117, and the stencil has a set of corresponding openings, such as set 115, for each of the plurality of individual pc boards. Although the top view 202 of the stencil shows nine sets of openings, the invention is applicable to stencils with any number of sets of openings. The top view 202 of the stencil 112 shows broken lines indicating that the stencil may be extended in one direction, thereby having more than nine sets of openings, or thereby having larger size sets. Although not indicated in order to maintain clarity of illustration, the stencil 112 can also be extended in the transverse direction as well. A view 206 of the stencil 112 through cut line X—X is shown with indicator lines 204 and 205 cut into a top surface, or wear surface 212 of the stencil. The stencil has a thickness 203 of preferably six mils. The indicator lines are cut near the sets of openings. The indicator lines preferably have a width of twenty mils. The top surface, or wear surface 212 of the stencil is worn away by the rubbing of the squeegee and the solder paste against the top surface when the squeegee moves in the directions indicated by arrow 211. The indicator lines are cut to a depth 207 such that when they are worn away by the rubbing of the squeegee against the stencil, an insufficient amount of solder paste accumulates onto the substrate 116 due to the thinness 209 of the stencil. Typically, the indicator lines have a depth 207 of one mil when the thickness of the stencil is six mils. The indicator lines 204 and 205 are visible to a person viewing the stencil. Advantageously, when the person no longer sees the indicator lines 204 and 205, the person realizes that the stencil is worn too much. The indicator lines preferably extend longitudinally in the direction of movement of the squeegee, as indicated by arrow 211, although any direction is foreseeable. Although two indicator lines are shown, a greater or lesser number of indicator lines are foreseeable. Of course, the bottom surface 214 of the stencil is not worn by the squeegee. A view 208 of the stencil through cut line Y—Y is shown with a portion of the squeegee 110 proximal thereto. A view of the squeegee through cut line Z—Z is also shown in relation to the top view 202 of the stencil.

An alternative embodiment of the invention is shown in FIG. 3. A top view 302 of the stencil 112 of FIG. 1 is shown. The top view 302 of the stencil 112 shows broken lines indicating that the stencil may be extended in one direction, thereby having more than nine sets of openings, or thereby having larger size sets. Although not indicated in order to maintain clarity of illustration, the stencil 112 can also be extended in the transverse direction as well. A view 306 of the stencil 112 through cut line X—X is shown with indicator lines 304 and 305 cut into a bottom surface 314 of the stencil. In the alternative embodiment, the indicator lines are preferably discontinuous in order not to structurally weaken the stencil. The stencil has a thickness 203 of preferably six mils. The indicator lines are cut near the sets of openings in order to most accurately measure the thickness of the stencil at the openings. The indicator lines preferably have a width of twenty mils. The indicator are cut to a depth 309 such that when the wear surface 312 is worn down and the indicator lines become visible at the wear surface 312, an insufficient amount of solder paste accumulates onto the substrate 116 through openings 301. Typically, the indicator lines have a depth of five mils when the thickness of the stencil is six mils. The indicator lines 304 and 305 are normally not visible to a person viewing the wear surface 312 of the stencil. Advantageously, when the person sees the indicator lines 304 and 305 while viewing the wear surface 312 of the stencil, the person realizes that the stencil is worn too much. The indicator lines preferably extend longitudinally in the direction of movement of the squeegee, as indicated by arrow 211, although any direction is foreseeable. Although two indicator lines are shown, a greater or lesser number of indicator lines are foreseeable. A view 308 of the stencil through cut line Y—Y is shown with a portion of the squeegee 110 proximal thereto. A view of the squeegee through cut line Z—Z is also shown in relation to the top view 302 of the stencil. Each of the indicator lines 204, 205, 304 and 305 act as a solder mask stencil wear indicator.

A description of an automated process of applying solder paste to printed circuit boards is described in U. S. Pat. No. 5,436,028 entitled Method and Apparatus for Selectively Applying Solder Paste to Multiple Types of Printed Circuit Boards, issued, Jul. 25, 1995, to Becher, et al., assigned to the assignee of the present invention, and which is hereby fully incorporated herein by reference.

While a detailed description of the preferred embodiments of the invention has been given, it should be appreciated that many variations can be made thereto without departing from the scope of the invention as set forth in the appended claims. For example, in the alternative embodiment, the method of detecting the indicator lines becoming visible when observing the wear surface can be automated in several ways, such as by having a light source at the area below the bottom surface and having a light detector above the top surface. When light is detected by the light detector, the stencil is too thin.

I claim:

1. A solder mask stencil wear indicator, comprising:

a solder mask stencil having a thickness and a wear surface, and an indicator line formed by material pre-removed from the wear surface of the solder mask stencil, the indicator line having a depth less than the thickness of the solder mask stencil.

2. The solder mask stencil wear indicator of claim 1, in which the solder mask stencil is metal.

3. A solder mask stencil wear indicator, comprising:

a solder mask stencil having a thickness, a wear surface and a bottom surface opposite the wear surface, and an indicator line formed by material removed from the bottom surface of the solder mask stencil, the indicator line having a depth less than the thickness of the solder mask stencil.

4. The solder mask stencil wear indicator of claim 3, in which the solder mask stencil is stainless steel.

5. In a stencil solder printing machine, having a stencil and a squeegee, the stencil having a thickness and a wear surface, the stencil having an indicator line formed by material pre-removed from the wear surface of the stencil, a method for determining the thickness of the stencil, comprising the steps:

(a) rubbing the squeegee across the wear surface of the stencil.

(b) inspecting the wear surface of the stencil for existence of the indicator line, and (c) repeating step (b) until the indicator line is no longer existent.

6. The method of claim 5 in which the squeegee and the stencil are metal.

* * * * *